United States Patent
Cha et al.

(10) Patent No.: US 6,790,716 B2
(45) Date of Patent: Sep. 14, 2004

(54) METHOD FOR MANUFACTURING A THIN FILM TRANSISTOR ARRAY PANEL

(75) Inventors: Jong-Hwan Cha, Pusan (KR);
Geun-Ha Jang, Yongin (KR);
Dae-Sung Yi, Seoul (KR)

(73) Assignee: Samsung Electronics Co., LTD., Suwon (KR)

( * ) Notice: Subject to any disclaimer, the term of this patent is extended or adjusted under 35 U.S.C. 154(b) by 160 days.

(21) Appl. No.: 10/271,765

(22) Filed: Oct. 17, 2002

(65) Prior Publication Data

US 2003/0036277 A1 Feb. 20, 2003

Related U.S. Application Data

(60) Continuation of application No. 09/781,987, filed on Feb. 14, 2001, which is a division of application No. 09/405,178, filed on Sep. 24, 1999, now Pat. No. 6,207,480.

(30) Foreign Application Priority Data

Oct. 29, 1998 (KR) .......................................... 98-45710

(51) Int. Cl.[7] .............................................. H01L 21/84
(52) U.S. Cl. ...................................... 438/155; 438/158
(58) Field of Search ........................ 438/30, 149, 151, 438/155, 158, 164, 958

(56) References Cited

U.S. PATENT DOCUMENTS

| | | | |
|---|---|---|---|
| 5,259,881 A | 11/1993 | Edwards et al. ............ 118/719 |
| 5,512,320 A | 4/1996 | Turner et al. ............... 427/255 |
| 5,528,082 A | 6/1996 | Ho et al. .................... 257/775 |
| 5,614,055 A | 3/1997 | Fairbairn et al. ........... 427/569 |
| 5,739,877 A | 4/1998 | Onisawa et al. ............. 349/42 |
| 6,013,162 A | 1/2000 | Kobayashi et al. .... 204/298.03 |
| 6,019,796 A | 2/2000 | Mei et al. ................... 438/151 |
| 6,043,511 A | * 3/2000 | Kim ............................ 257/59 |
| 6,077,730 A | * 6/2000 | Lee et al. ................... 438/151 |
| 6,087,678 A | * 7/2000 | Kim ............................ 257/59 |

* cited by examiner

*Primary Examiner*—Chandra Chaudhari
(74) *Attorney, Agent, or Firm*—McGuirewoods, LLP

(57) ABSTRACT

A gate insulating layer, an amorphous silicon layer, a doped amorphous silicon layer and a Cr layer are sequentially deposited on a substrate on which a gate wire is formed. Next, the Cr layer is patterned to form a data line, a source electrode and a drain electrode. The doped amorphous silicon layer and the amorphous silicon layer are patterned at the same time, and the doped amorphous silicon layer is etched by using the data line, the source electrode and the drain electrode as etch stopper. Subsequently, a passivation layer is deposited and patterned to form a contact hole. An ITO layer is deposited and patterned to form a pixel electrode. According to the present invention, an oxide layer is prevented by performing a sequential deposition of the four layers in a vacuum state. As a result, the on current of the TFT is increased, and HF cleaning is not necessary because no oxide layer is formed. Therefore, the overall TFT manufacturing process is simplified.

11 Claims, 13 Drawing Sheets

METHOD FOR MANUFACTURING A THIN FILM TRANSISTOR ARRAY PANEL

The present application is a continuation of the U.S. patent application Ser. No. 09/781,987 filed Feb. 14, 2001, which is a divisional of U.S. patent application Ser. No. 09/405,178 filed Sep. 24, 1999, which now became U.S. Pat. No. 6,207,480.

BACKGROUND OF THE INVENTION (a) Field of the Invention

The present invention relates to a method for manufacturing a thin film transistor (TFT) array panel for a liquid crystal display (LCD).

(b) Description of the Related Art

Thin film transistors used for an LCD have two different types of structure. One is an etch-back type and the other is an etch-stopper type.

When manufacturing. an etch-back type TFT, an amorphous silicon layer and a doped amorphous silicon layer are deposited in sequence and patterned. Next, a metal layer is deposited and patterned to form a data wire including source and drain electrodes, and the doped amorphous silicon layer is etched by using the source and the drain electrodes as etching mask. In the etch stopper type TFT, an etch stopper, which has a large etch selectivity, is formed between an amorphous silicon layer and a doped amorphous silicon layer.

Now, a conventional method for manufacturing a TFT array panel for an LCD will be described with reference to the FIGS. 1A to 1D.

FIGS. 1A to 1D are cross-sectional views of a TFT array panel, as it undergoes sequential processing steps according to the conventional manufacturing method.

First, as shown in FIG. 1A, an aluminum-neodymium (Al—Nd) layer 11 and a molybdenum (Mo) layer 12 are sequentially deposited on a substrate 1 and patterned to form a gate electrode 10. That is, a gate wire having the gate electrode 10 is formed. A gate insulating layer 13, an amorphous silicon layer 14 and an n+ amorphous silicon layer 15 are sequentially deposited over the gate electrode 10.

Next, as shown in FIG. 1B, the amorphous silicon layer 14 and the n+ amorphous silicon layer 15 are patterned to form a semiconductor pattern. Subsequently, with reference to FIG. 1C, a metal layer is deposited on the n+ amorphous silicon layer 15 and patterned to form a source electrode 16 and a drain electrode 17. Before the deposition of the metal layer, a natural oxide layer (not shown) formed on the n+ amorphous silicon layer 15 is removed by a wet etch cleaning process using hydrogen fluoride (HF). Accordingly, the contact resistance between the n+ amorphous silicon layer 15 and both the source electrode 16 and the drain electrode 17 is reduced. After forming the source electrode 16 and the drain electrode 17, an exposed portion of the n+ amorphous silicon layer 15 is etched using the source and drain electrode 16 and 17 as mask.

As shown in FIG. 1D, a passivation layer 18 is deposited and patterned to have a contact hole 19 exposing the drain electrode 17. Finally, an indium tin oxide (ITO) layer is deposited and patterned to form a pixel electrode 20.

However, the conventional method for manufacturing a TFT array panel has many problems.

Impurities, which are generated during semiconductor patterning and HF cleaning processes, may remain on the n+amorphous silicon layer 15, and cause disconnections of the source electrode 16 and the drain electrode 17. Further, even with HF cleaning, portions of the natural oxide layer remain. The remaining natural oxide coupled with the impurities, degrades an ohmic contact between the n+ amorphous silicon layer 15 and both the source electrode 16 and the drain electrode 17, thereby reducing the on current (Ion) of the TFT. Furthermore, pixel electrodes 20 adjacent to a data line (not shown) interposed therebetween, may be short-circuited when forming the pixel electrodes 20 due to the ITO residues between the pixel electrodes 20. Finally, a photomask misalignment occurring in the photolithography process of forming the amorphous silicon layer 14 may result in stitch defects because the parasitic electrostatic capacitance (Cgd) between the gate electrode 10 and the drain electrode 17 becomes different depending on each photo shot.

SUMMARY OF THE INVENTION

It is therefore an object of the present invention to prevent disconnections of a source electrode and a drain electrode.

It is another object of the present invention to improve an ohmic contact between a semiconductor layer and both a source electrode and a drain electrode.

It is still another object of the present invention to prevent short-circuit between the adjacent pixel electrodes.

It is still yet another object of the present invention to reduce stitch defects.

These and other objects are achieved, according to the present invention, by the following process. After a gate wire is formed, a gate insulating layer, an amorphous silicon layer, a doped amorphous silicon layer and a data metal layer are sequentially deposited in vacuum. The data metal layer is patterned to form a data wire. Next, a doped amorphous silicon layer and an amorphous silicon layer are patterned.

In more detail, a TFT array panel is manufactured by a method including following processes. A gate wire is formed on an insulating substrate, then a gate insulating layer, an amorphous silicon layer and a metal layer are sequentially deposited. The metal layer is patterned to form a data line, a. source electrode and a drain electrode, and the amorphous silicon layer is also patterned. A passivation layer having a contact hole, which exposes a part of the drain electrode, is formed. Finally, a pixel electrode, which is connected to the drain electrode through the contact hole, is formed.

It is preferable that the sequence deposition of the gate insulating layer, the amorphous silicon layer and the metal layer is performed in a vacuum state.

It is possible to deposit a doped amorphous silicon layer after the deposition of the amorphous silicon layer in the sequential deposition process of the amorphous silicon layer and the metal layer, the doped amorphous silicon layer also being patterned when patterning the amorphous silicon layer. After patterning the amorphous silicon layer, the doped amorphous silicon layer is etched by using the data line, the source electrode and the drain electrode as etch stopper.

It is also possible to include the deposition of the doped amorphous silicon layer after the deposition of the amorphous silicon layer in the sequential deposition process of the amorphous silicon layer and the metal layer. After patterning the data line, the source electrode and the drain electrode, the doped amorphous silicon layer is etched by using the data line, the source electrode and the drain electrode as etch stopper. It is preferable that the gate insulating layer, the amorphous silicon layer, the doped amorphous silicon layer and the metal layer are sequentially deposited in vacuum. An equipment that has integrated a sputter equipment and a chemical vapor deposition (CVD) equipment is used for this purpose.

The amorphous silicon layer may be patterned as follows. A photoresist pattern is formed through coating, exposure and development to have a width of 0.1 to 0.4 μm wider than the source electrode and the drain electrode but have the same width as or narrower than the data line. Next, the amorphous silicon layer is overetched to make a groove with a depth of 0.1 to 0.4 μm under the data line.

The gate wire may be a single layer and made of one of Al, an Al alloy, Mo, a Mo alloy, Cr, a Cr alloy, Ta and a Ta alloy, or double-layered and made of any two of the above described materials.

DETAILED DESCRIPTION OF THE PREFERRED EMBODIMENTS

Figure 1A:
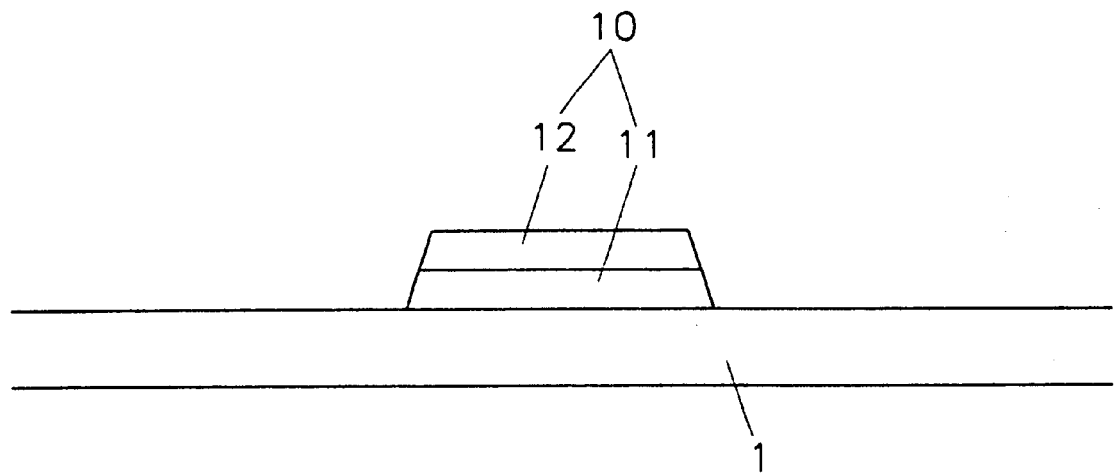
FIGS. 1A to 1D are cross-sectional views of a TFT array panel as it undergoes sequential processing steps according to a conventional manufacturing method.
Figure 1B:
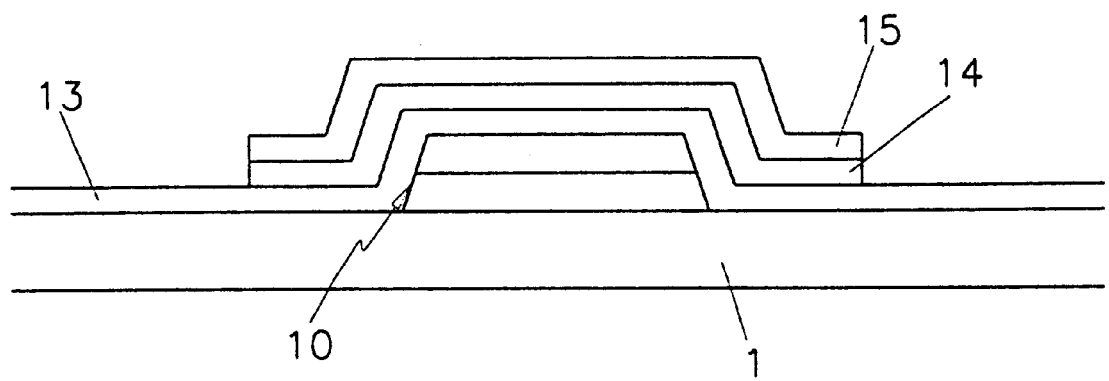
Figure 1C:
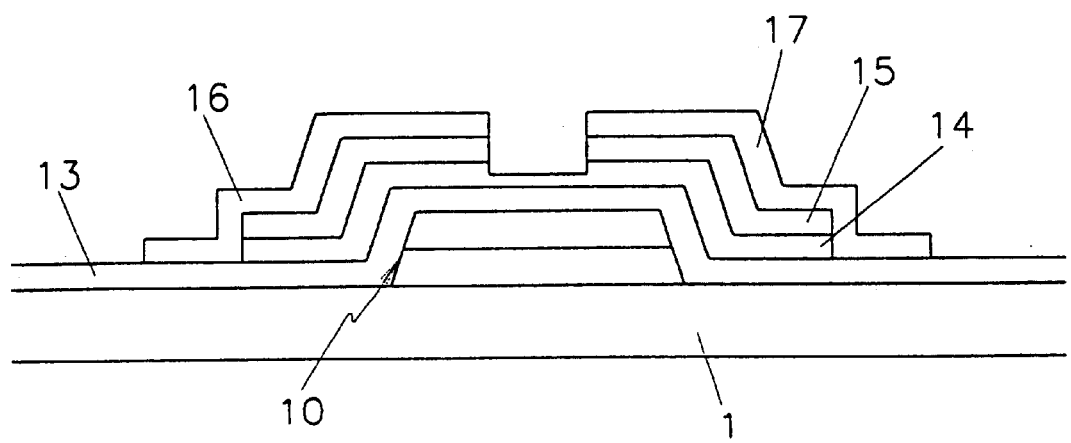
Figure 1D:
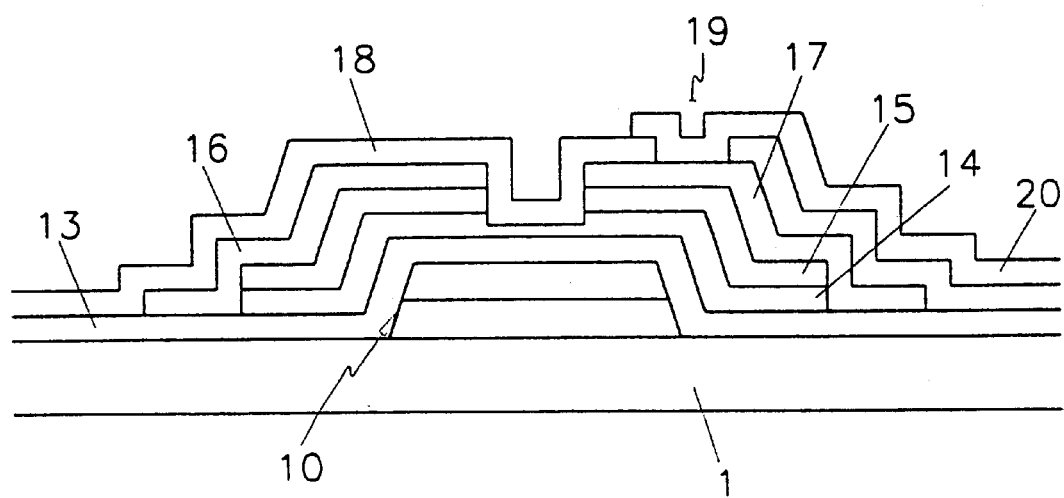

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

FIGS. 2, 4, 6, 8 and 10 are layout views of a TFT array panel as it undergoes sequential processing steps according to a manufacturing method of a preferred embodiment of the present invention. FIGS. 3, 5, 7, 9 and 11 are cross-sectional views respectively taken along lines III-III' of FIG. 2, IV-IV' of FIG. 4, VI-VI' of FIG. 6, VIII-VIII' of FIG. 8 and XI-XI' of FIG. 10.

Figure 2:
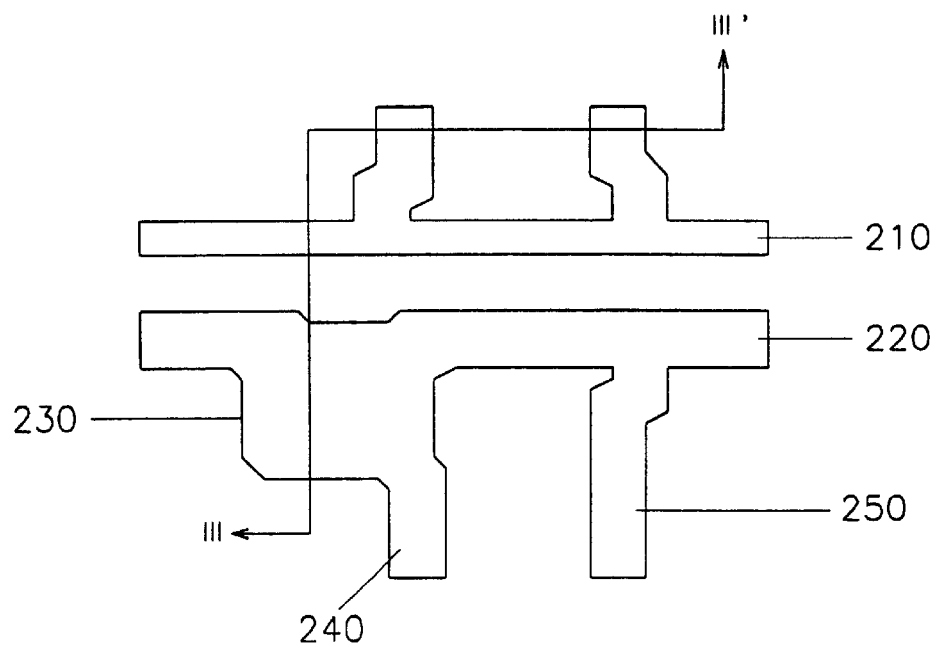
FIGS. 2, 4, 6, 8 and 10 are layout views of a TFT array panel as it undergoes sequential processing steps according to a manufacturing method of a preferred embodiment of the present invention.
Figure 3:
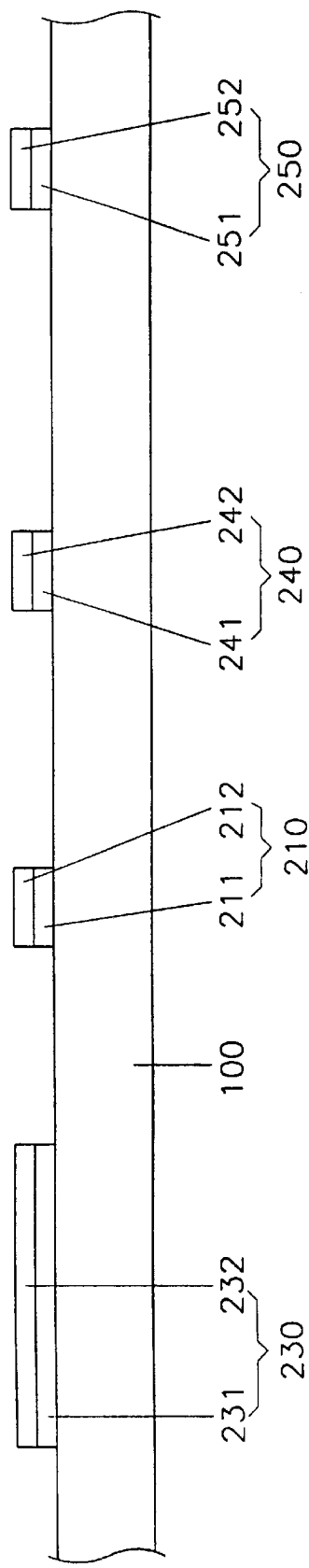
FIGS. 3, 5, 7, 9 and 11 are cross-sectional views respectively taken along lines III-III' of FIG. 2, IV-IV' of FIG. 4, VI-VI' of FIG. 6, VIII-VIII' of FIG. 8 and XI-XI' of FIG. 10.

First, as shown in FIGS. 2 and 3, a first metal layer of Al or an Al alloy such as Al—Nd and a second metal layer of one of Mo, Ta, Cr or their alloys are sequentially deposited on a non-conductive transparent substrate 100 and patterned by using a first photolithography process to form gate lines 210 and 220, a gate electrode 230 and gate line bridges 240 and 250. Accordingly, each of the gate lines 210 and 220, the gate electrode 230 and the gate line bridges 240 and 250 has a double-layer structure. That is, each of the gate lines 210 and 220 includes a lower metal layer 211 and an upper metal layer 212; the gate electrode 230 includes a lower metal layer 231 and an upper metal layer 232; and the gate line bridge 250 includes a lower metal layer 251 and an upper metal layer 252. However, these elements are not limited to a double-layer structure and it is possible to employ a single-layer structure.

Figure 4:
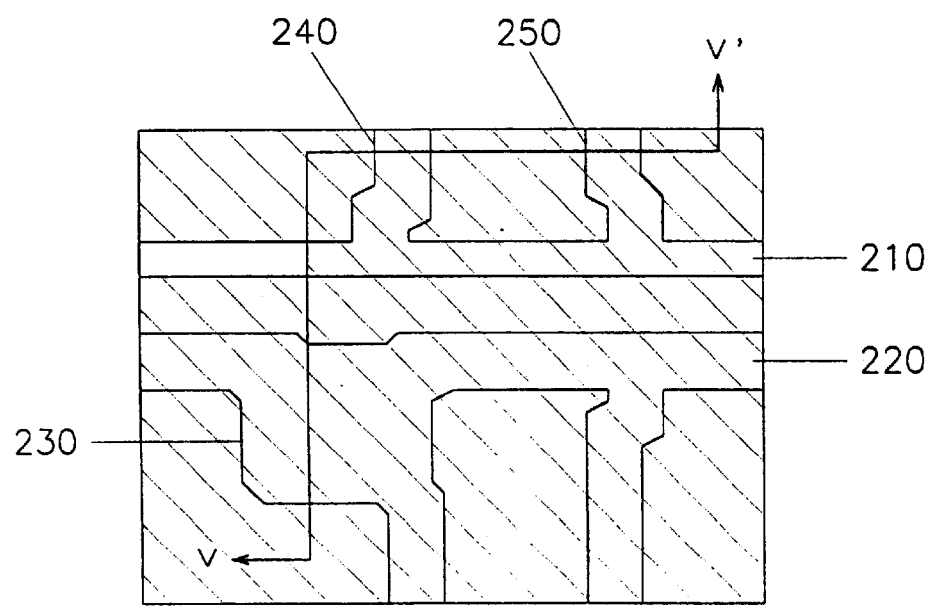
Figure 5:
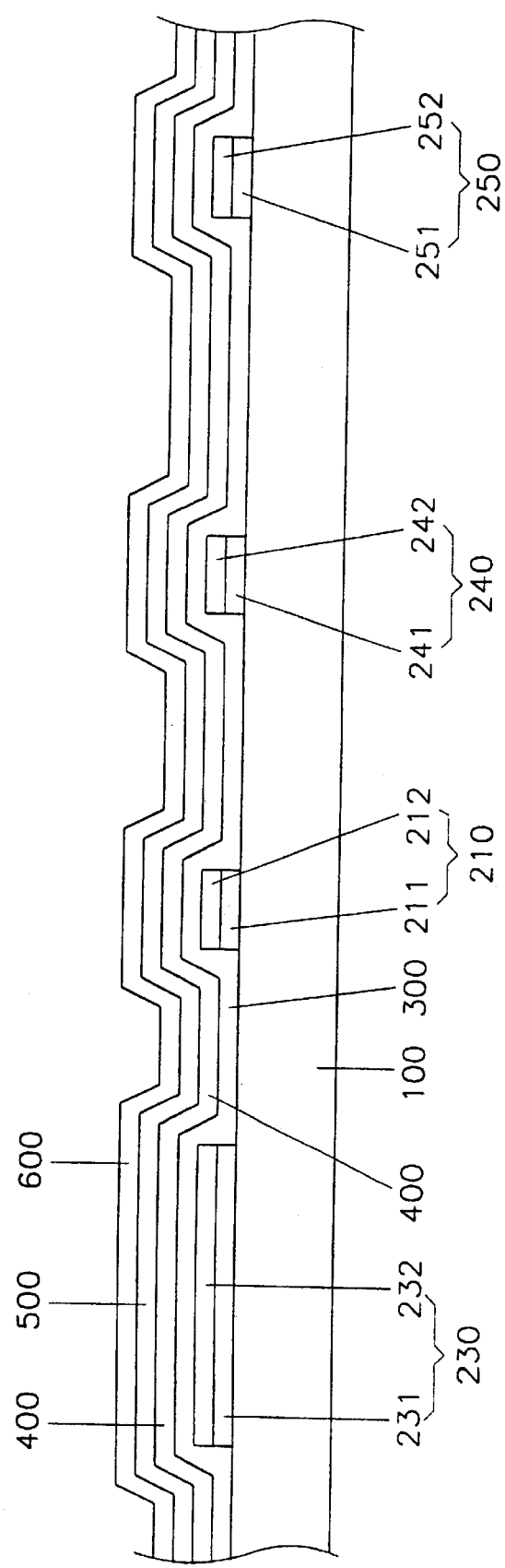

Next, as shown in FIGS. 4 and 5, a gate insulating layer 300, a amorphous silicon layer 400 and a doped amorphous silicon layer 500 are sequentially deposited using a CVD method. Subsequently, the substrate 100 is moved to a sputter chamber, which is integrally formed with other chambers of CVD equipment, and a Cr layer 600 is deposited on the doped amorphous silicon layer 500 by sputtering. At this time, it is preferable that the substrate 100 is maintained in a vacuum state throughout the entire process of depositing the four layers and not to be exposed to air. This prevents oxidization of an upper surface of the doped amorphous silicon layer (500). This vacuum state is made possible by using a new equipment having a sputter chamber in addition to the conventional CVD equipment.

The four layers may be sequentially deposited without using such a new equipment, but the substrate 100 is exposed to air while moving it from the CVD equipment to the sputter chamber. This exposure may form an oxide layer on the upper surface of the doped amorphous silicon layer 500.

Figure 12:
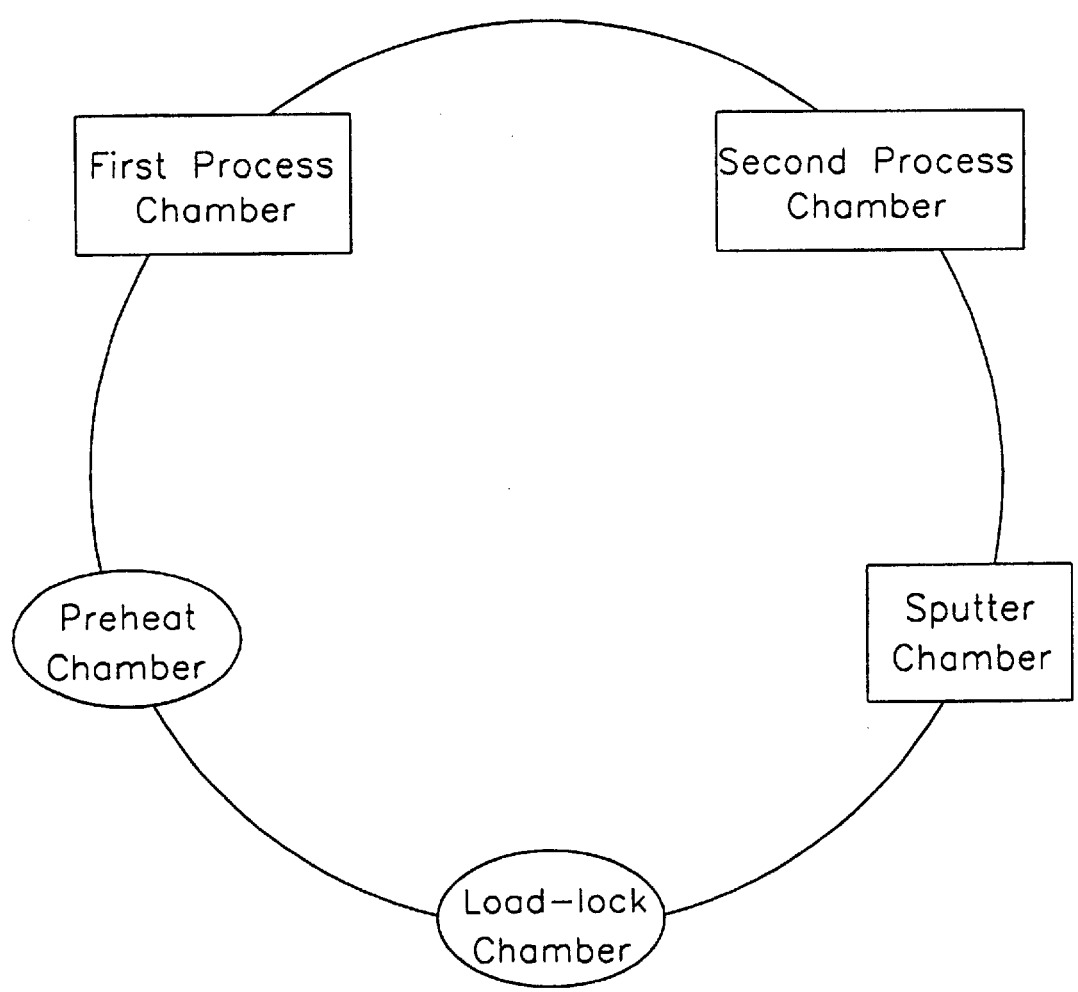
FIG. 12 is a diagram showing the organization of the sputter-CVD equipment used in the preferred embodiment of the present invention.

FIG. 12 is a diagram of showing the organization of the CVD equipment that has integrated with a sputter chamber. The CVD equipment includes a load lock chamber in which the substrate 100 stands by, a preheat chamber that heats the substrate 100 before deposition, a plurality of process chambers in which thin layers are deposited by a CVD method, and a sputter chamber in which a metal layer is deposited.

The four layers are sequentially deposited using the above described equipment as follows. First, the substrate 100, on which the gate wire pattern is formed is placed in the load lock chamber, and then moved into the preheat chamber to be preheated. Next, the substrate 100 is moved into the first process chamber where the gate insulating layer 300 and the amorphous silicon layer 400 are deposited on the substrate 100. Following this step, the substrate 100 moves into the second process chamber where the doped amorphous silicon layer 500 is deposited. Then, the substrate 100 moves into the sputter chamber through a vacuum passage where the Cr layer 600 is doped on the doped amorphous silicon layer 500. The vacuum passage can be formed by a passage chamber. At this time, the gate insulating layer 300, the amorphous silicon layer 400 and the doped amorphous silicon layer 500 are deposited respectively to a thickness of 3,000 to 6,000 Å, 1,000 to 3,000 Å and 200 to 1,000 Å.

Figure 6:
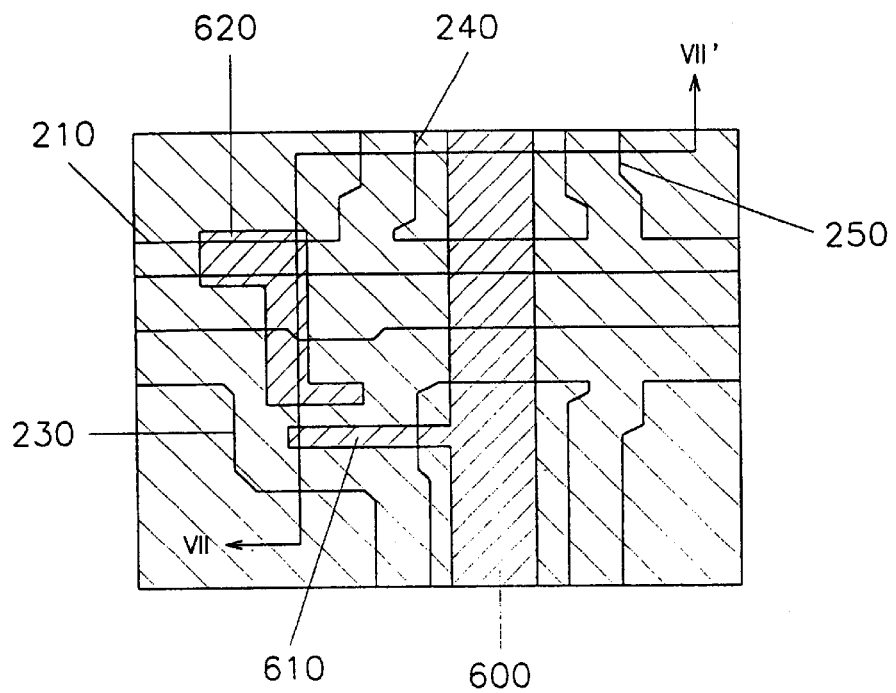
Figure 7:
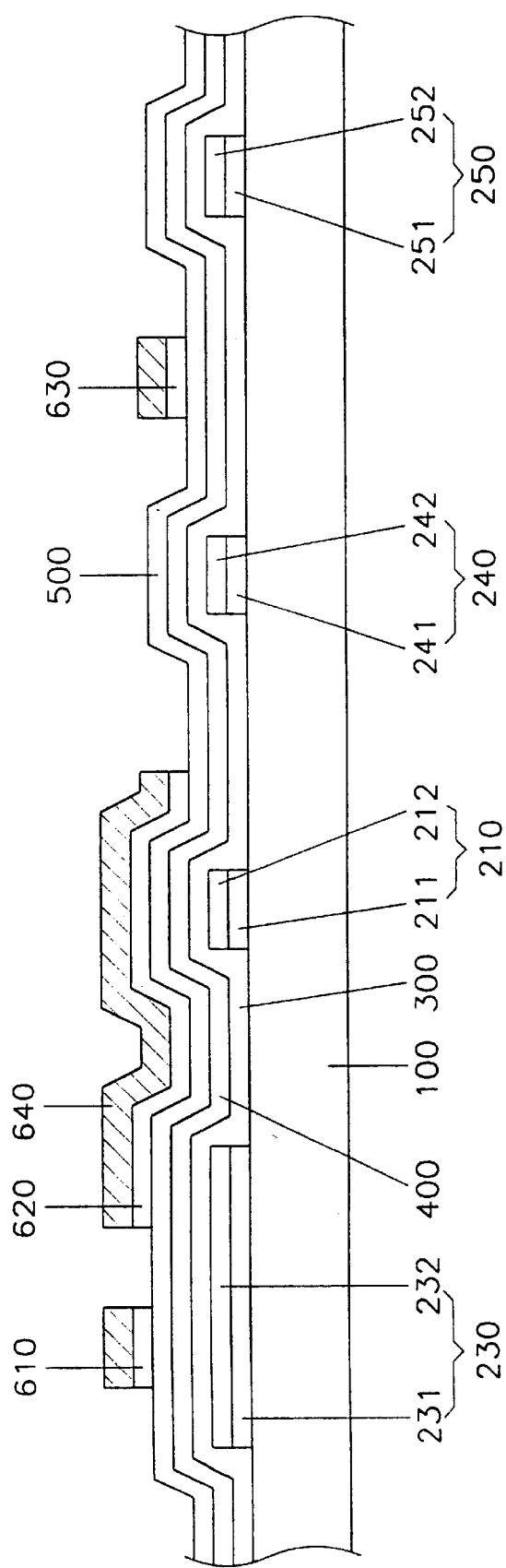

As shown in FIGS. 6 and 7, a photoresist layer pattern 640 is formed by using a second photolithography process, and -the exposed Cr layer 600 is etched to form a data wire pattern including a data line 630, a source electrode 610 and a drain electrode 620.

Figure 8:
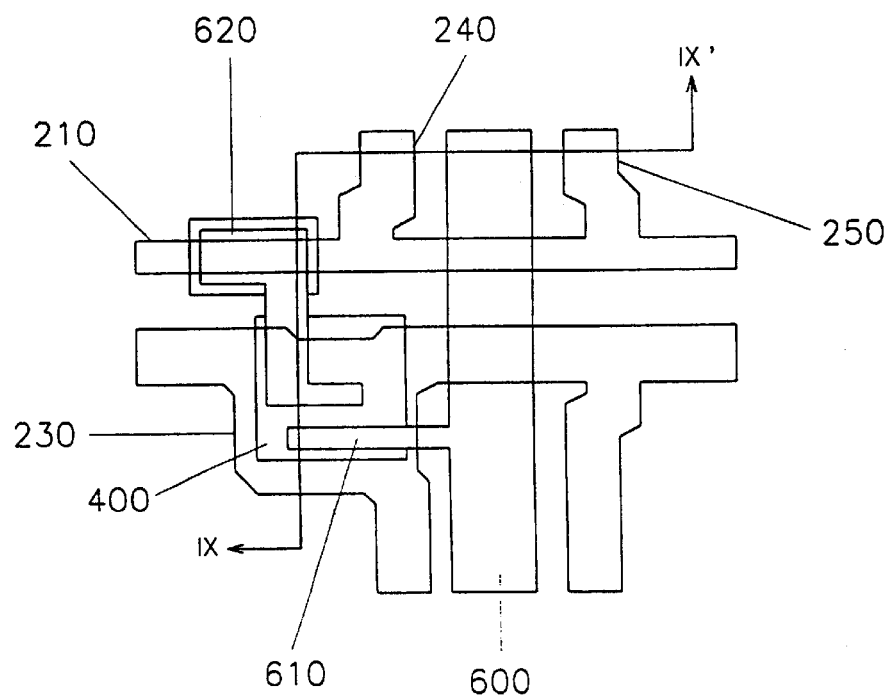
Figure 9:
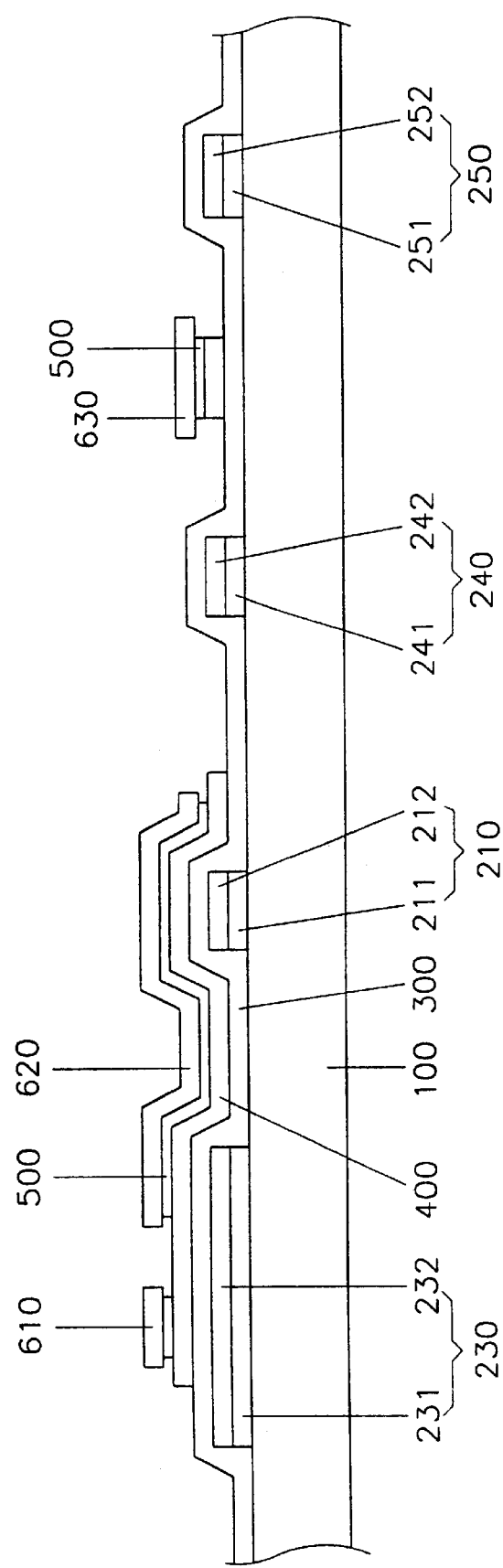

Next, as shown in FIGS. 8 and 9, the doped amorphous silicon layer 500 and the amorphous silicon layer 400 are patterned. There are two methods to pattern the doped amorphous silicon layer 500 and the amorphous silicon layer 400.

In the first method, the doped amorphous silicon layer 500 is etched to form a pattern by using the photoresist layer 640 or the data wire pattern as etch stopper. Next, another photoresist layer is coated and patterned to form a photoresist layer pattern (not shown), which covers peripheries of the source electrode 610 and the drain electrode 620 to protect the thin film transistor's channel area, by using a third photolithography process. Next, the exposed amorphous silicon layer 400 is etched.

In the second method, the photoresist layer 640, which is used to form the data wire pattern, is first removed. Next, another photoresist layer is coated and patterned to form a photoresist layer pattern (not shown), which covers peripheries of the source electrode 610 and the drain electrode 620 in order to protect the channel area of the thin film transistor, by using the third mask. Subsequently, the exposed amorphous silicon layer 400 and the doped amorphous layer 500 are simultaneously etched, and then photoresist layer pattern is removed. Finally, the doped amorphous silicon layer 500 is etched to form the last pattern by using the data wire pattern as etch stopper.

Whichever method is used, the photoresist layer pattern is formed to have an extra width of 0.1 to 0.4 $\mu$m wider than the length that completely covers the source electrode 610 and the drain electrode 620, and to have a boundary line that is identical to or narrower than that of the data line under the photoresist layer pattern. Also, the amorphous silicon layer 400 is overetched to form a groove having a depth of 0.1 to 0.4 $\mu$m under the data line 630. The doped amorphous silicon layer 500 may also be overetched to form a groove having a depth of 0.1 to 0.4 $\mu$m under the data line 630.

Figure 10:
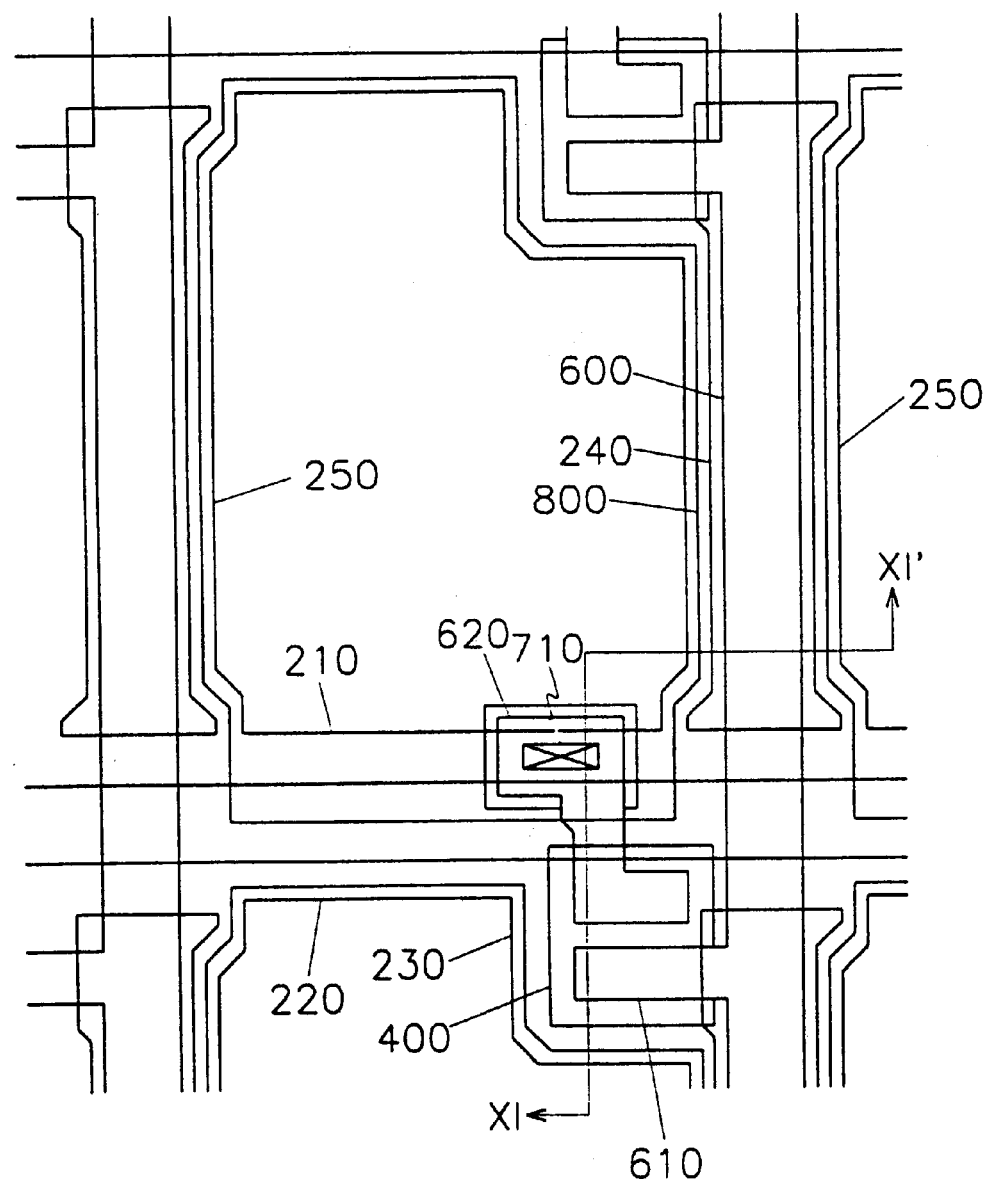
Figure 11:
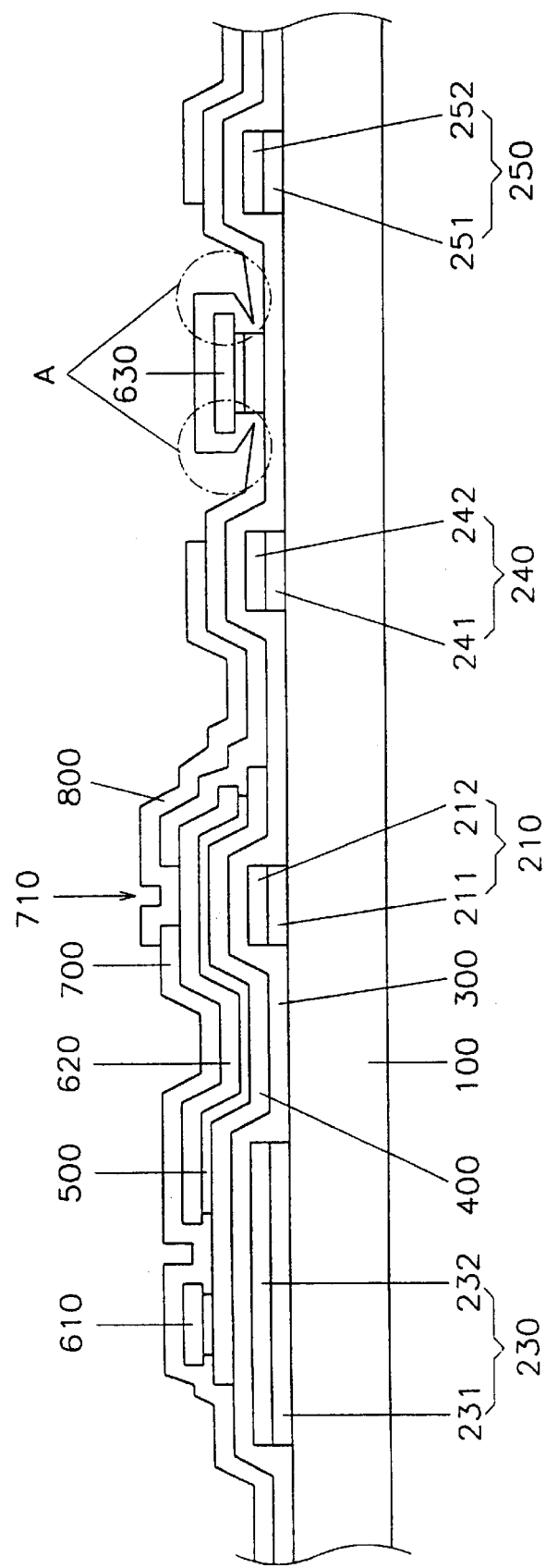

Next, as shown in FIGS. 10 and 11, a passivation layer 700 is deposited and patterned to form a contact hole 710 using a fourth photolithography process, which exposes the drain electrode. An ITO layer is deposited on the passivation layer 700 and patterned to form a pixel electrode 800, which is connected to the drain electrode 620 through the contact hole 710, using a fifth mask.

In the step of forming the pixel electrode 800, even if the ITO layer is not fully etched and leaves residual ITO layer on the passivation layer 700 over the data line 630, the remaining ITO layer is broken off at portions (A), which are grooves formed by the overetched amorphous silicon layer 400 and the overetched doped amorphous silicon layer 500. Therefore, the pixel electrodes 800, which are located on opposing sides of the data line 630, can be prevented from being short-circuited.

Figure 13:
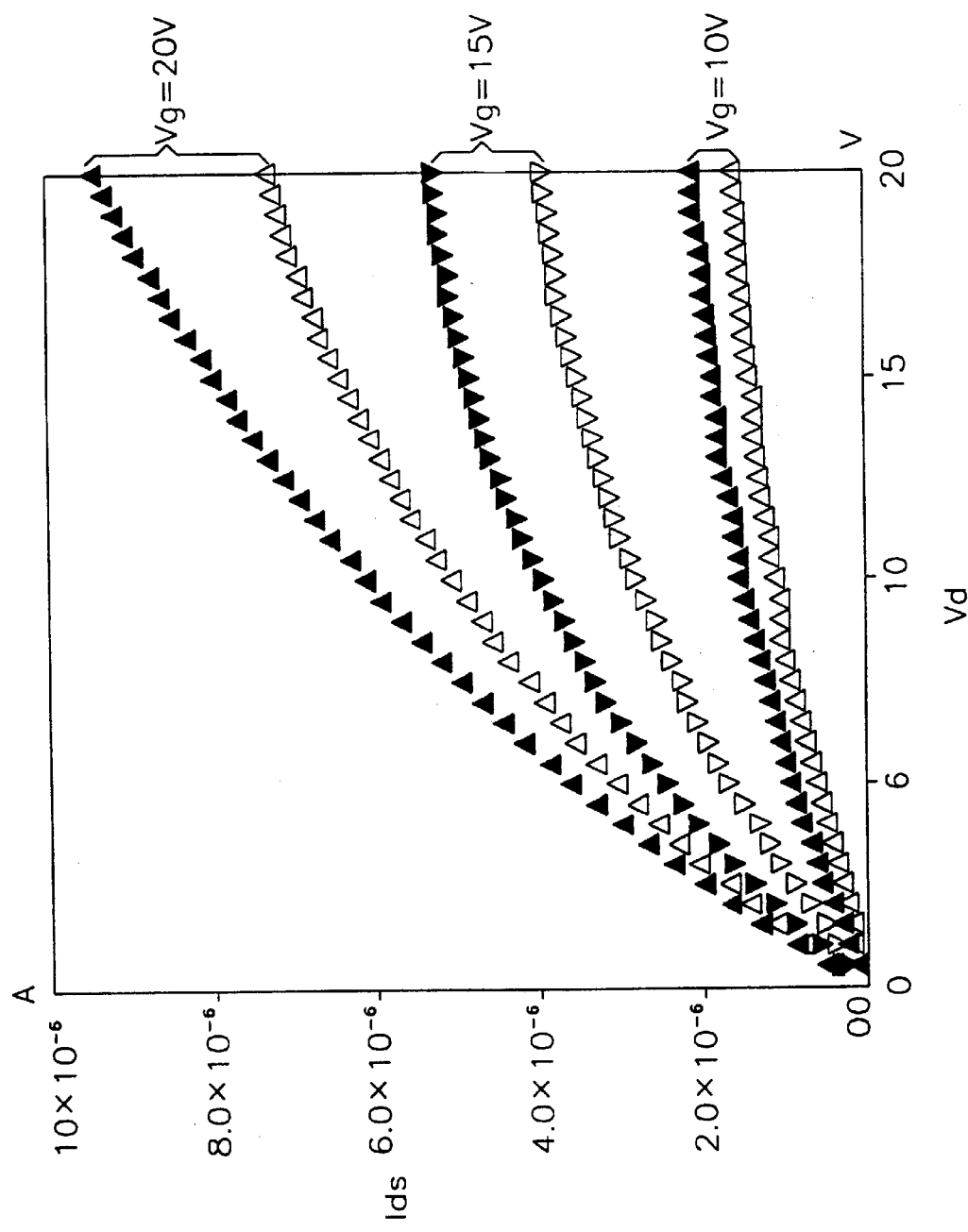
FIG. 13 is a graph comparing an on current of the TFT according to the preferred embodiment of the present invention with that of the conventional TFT.
Figure 14:
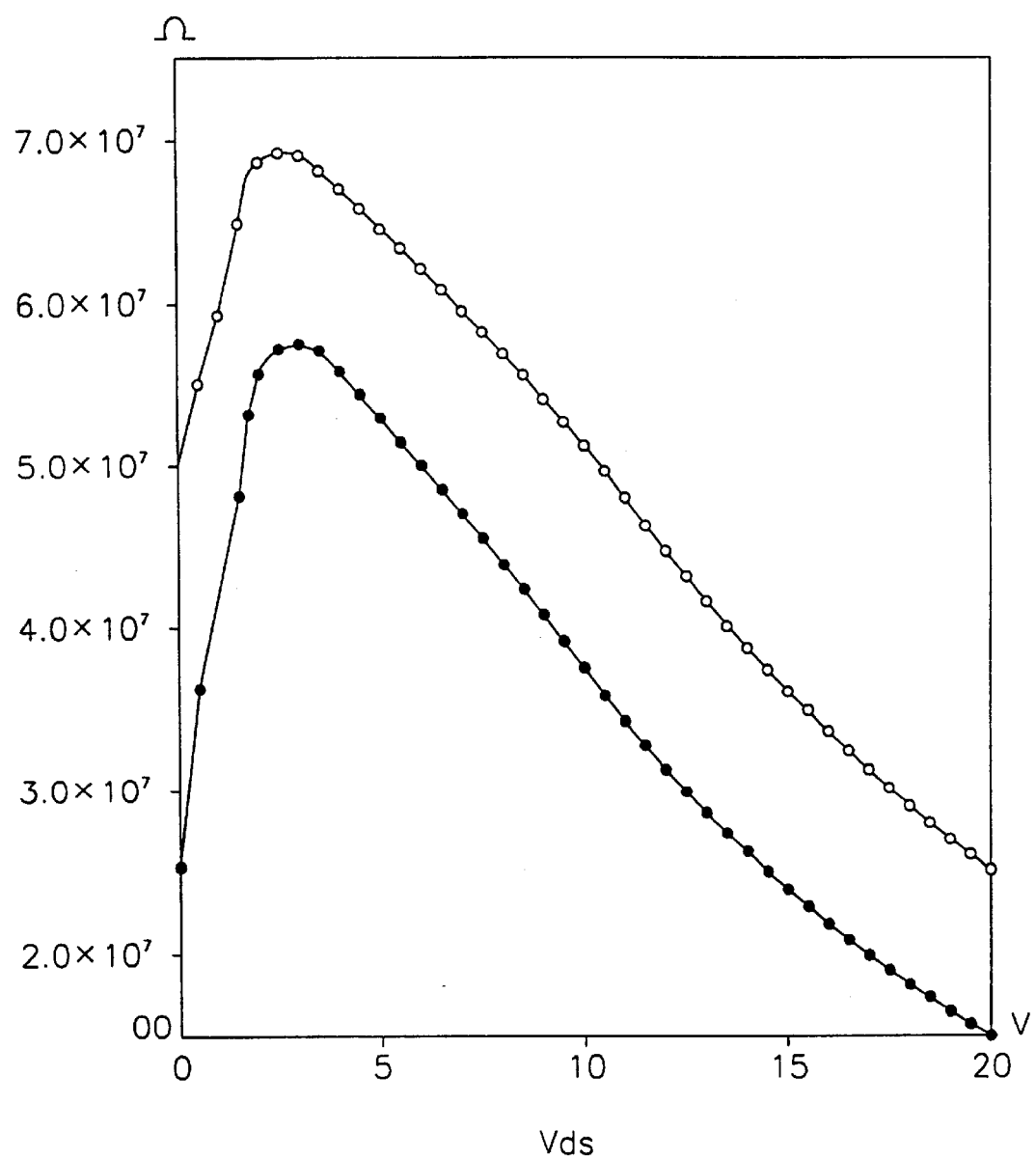
FIG. 14 is a graph comparing a contact resistance between a doped amorphous silicon layer and both a source electrode and a drain electrode of the TFT according to the preferred embodiment of the present invention with that of the conventional TFT.

FIG. 13 is a graph comparing an on current of the TFT according to the preferred embodiment of the present invention with that of the conventional TFT. FIG. 14 is a graph comparing a contact resistance between the doped amorphous silicon layer 500 and both the source electrode 610 and the drain electrode 620 of the TFT according to the preferred embodiment of the present invention with that of the conventional TFT.

In FIG. 13, the on current distribution of the conventional TFT is represented by white triangles, and that of the TFT according to the preferred embodiment of the present invention is represented by black triangles.

As shown in FIG. 13, regardless of what value a gate voltage (Vg) and a data voltage are, the on current of the TFT according to the present invention is lager than that of the conventional TFT. This is because of mobility differences. That is, the mobility of the conventional TFT is about 0.5 cm$^2$/v·sec, but that of the TFT according to the present invention is about 0.79 cm$^2$/v·sec.

In FIG. 14, the distribution of the contact resistance according to the voltage variance between the source electrode and the drain electrode of the TFT according to the present invention is represented by black circles, and that of the conventional TFT is represented by white circles.

As shown in FIG. 14, regardless of the level of a voltage (Vds) between the source electrode and the drain electrode, the contact resistance of the TFT according to the present invention is smaller than that of the conventional TFT.

In the present invention described above, an oxide layer is prevented by sequentially depositing layers in a vacuum state. Therefore, the on current of the TFT is increased. Further, HF cleaning can be omitted because no oxide layer is formed. Therefore, the overall TFT manufacturing process is simplified.

Moreover, adjacent pixel electrodes is protected from short-circuit by forming grooves between the pixel electrodes. Since the semiconductor layer is widely distributed under the source electrode and the drain electrode, even if the photomask misaligns while forming the semiconductor layer pattern and the source and the drain electrodes, the parasitic capacitance between the gate electrode and the source electrode does not substantially fluctuate. Therefore, kickback voltage also does not widely fluctuate. This ultimately prevents the stitch defects.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A method for manufacturing a thin film transistor array panel, comprising steps of:

forming a gate wire on an insulating substrate;

sequentially depositing a gate insulating layer, an amorphous silicon layer, a doped amorphous silicon layer and a metal layer;

patterning the metal layer to form a data line, a source electrode and a drain electrode;

etching the doped amorphous silicon layer;

depositing a photoresist layer;

patterning the photoresist layer to cover at least the portion between the source electrode and the drain electrode to expose at least a portion of one among the group of the data line, the source electrode and the drain electrode;

patterning the amorphous silicon layer using the photoresist layer and the exposed portion of the data line, the source electrode and the drain electrode as mask;

forming a passivation layer having a contact hole that exposes a portion of the drain electrode; and forming a pixel electrode connected to the drain electrode through the contact hole.

2. The method of claim 1, wherein the step of sequentially depositing a gate insulating layer, an amorphous silicon layer, a doped amorphous silicon layer and a metal layer is performed in a vacuum state using an equipment where a sputter equipment and a chemical vapor deposition equipment are integrally formed.

3. The method of claim 1, wherein the patterned photoresist layer has an extra width of 0.1 to 0.4 $\mu$m after completely covering the source electrode and the drain electrode with a boundary line that is identical to or narrower than that of the data line, and wherein the patterned amorphous silicon layer has narrower width than the data line to make a groove having a depth of 0.1 to 0.4 μm under the data line.

4. The method of claim 1, wherein the gate wire is a single layer and made of one among the group of aluminum, an aluminum alloy, molybdenum, an molybdenum alloy, chromium, a chromium alloy, tantalum and a tantalum alloy.

5. The method of claim 1, wherein the gate wire is of a double layer and made of any two among the group of aluminum, an aluminum alloy, molybdenum, an molybdenum alloy, chromium, a chromium alloy, tantalum and a tantalum alloy.

6. The method of claim 1, wherein the patterned amorphous silicon layer has a portion that is narrower than the data line.

7. A method for manufacturing a thin film transistor array panel, comprising steps of:

forming a gate wire on an insulating substrate;

sequentially depositing a gate insulating layer, an amorphous silicon layer, a doped amorphous silicon layer and a metal layer;

patterning the metal layer to form a data line, a source electrode and a drain electrode;

depositing a photoresist layer;

patterning the photoresist layer to cover at least the portion between the source electrode and the drain electrode and to expose at least a portion of one among the group of the data line, the source electrode and the drain electrode;

patterning the doped amorphous silicon layer and the amorphous silicon layer;

removing the photoresist layer pattern;

forming a passivation layer having a contact hole that exposes a portion of the drain electrode; and forming a pixel electrode connected to the drain electrode through the contact hole.

8. The method of claim 7, wherein the step of sequentially depositing a gate insulating layer, an amorphous silicon layer, a doped amorphous silicon layer and a metal layer is performed in a vacuum state using an equipment where a sputter equipment and a chemical vapor deposition equipment are integrally formed.

9. The method of claim 7, wherein the patterned photoresist layer has a width redundancy of 0.1 to 0.4 μm after completely covering the source electrode and the drain electrode and had a boundary line that is identical to or narrower than that of the data line, and wherein the patterned amorphous silicon layer is narrower in width that the data line to make a groove having a depth of 0.1 to 0.4 μm under the data line.

10. The method of claim 7, wherein the gate wire is a single layer and made of one among the group of aluminum, an aluminum alloy, molybdenum, an molybdenum alloy, chromium, a chromium alloy, tantalum and a tantalum alloy.

11. The method of claim 7, wherein the gate wire is of a double layer and made of any two among the group of aluminum, an aluminum alloy, molybdenum, an molybdenum alloy, chromium, a chromium alloy, tantalum and a tantalum alloy.

* * * * *